(12) United States Patent
Simin et al.

(10) Patent No.: US 10,256,334 B2
(45) Date of Patent: Apr. 9, 2019

(54) GATELESS SWITCH WITH CAPACITIVELY-COUPLED CONTACTS

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 65 days.

(21) Appl. No.: 15/137,772

(22) Filed: Apr. 25, 2016

(65) Prior Publication Data
US 2016/0359031 A1 Dec. 8, 2016

Related U.S. Application Data

(63) Continuation-in-part of application No. 14/082,998, filed on Nov. 18, 2013, now Pat. No. 9,349,848,
(Continued)

(51) Int. Cl.
| | |
|---|---|
| H01L 29/778 | (2006.01) |
| H01L 29/06 | (2006.01) |
| H01L 23/66 | (2006.01) |
| H01L 29/20 | (2006.01) |
| H01L 29/205 | (2006.01) |
| H01L 29/772 | (2006.01) |

(Continued)

(52) U.S. Cl.
CPC .......... *H01L 29/7787* (2013.01); *H01L 23/66* (2013.01); *H01L 27/0605* (2013.01); *H01L 29/0692* (2013.01); *H01L 29/2003* (2013.01); *H01L 29/205* (2013.01); *H01L 29/772* (2013.01); *H01L 29/8605* (2013.01); *H01P 1/15* (2013.01); *H01H 59/0009* (2013.01); *H01H 2001/0078* (2013.01); *H01L 2223/6627* (2013.01); *H01L 2924/0002* (2013.01); *H01L 2924/12044* (2013.01); *H01L 2924/19032* (2013.01); *H01L 2924/19051* (2013.01); *H01L 2924/3011* (2013.01)

(58) Field of Classification Search
CPC ................................................... H01L 29/7787
See application file for complete search history.

(56) References Cited

U.S. PATENT DOCUMENTS

| | | | | |
|---|---|---|---|---|
| 8,587,028 B2 * | 11/2013 | Simin | ..................... | H01L 23/66 257/192 |
| 2006/0175633 A1 * | 8/2006 | Kinzer | ................ | H01L 27/0605 257/192 |
| 2007/0114568 A1 * | 5/2007 | Simin | ..................... | H01L 29/94 257/192 |

OTHER PUBLICATIONS

Koudymov et al., "HfO2-III-Nitride RF Switch With Capacitively Coupled Contacts", IEEE Electron Device Letters, vol. 30, No. 5, pp. 478-480, May 2009.
(Continued)

*Primary Examiner* — Davienne N Monbleau
*Assistant Examiner* — Leslie Pilar Cruz
(74) *Attorney, Agent, or Firm* — LaBatt, LLC

(57) ABSTRACT

A switch includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency switch in a circuit.

20 Claims, 15 Drawing Sheets

Related U.S. Application Data which is a continuation of application No. 12/651,470, filed on Jan. 3, 2010, now Pat. No. 8,587,028.

(60) Provisional application No. 61/204,368, filed on Jan. 6, 2009.

(51) Int. Cl.
*H01L 27/06* (2006.01)
*H01L 29/8605* (2006.01)
*H01P 1/15* (2006.01)
*H01H 59/00* (2006.01)
*H01H 1/00* (2006.01)

(56) References Cited

OTHER PUBLICATIONS

Koudymov et al., "Monolithically Integrated High-Power Broad-Band Rf Switch Based on III-N Insulated Gate Transistors", IEEE Microwave and Wireless Components Letters, vol. 14, No. 12, pp. 560-562, Dec. 2004.

Simin et al., "High-Power RF Switching Using III-Nitride Metal-Oxide-Semiconductor Heterojunction Capacitors", IEEE Electron Device Letters, vol. 26, No. 2, pp. 56-58, Feb. 2005.

Simin et al., "High-power III-Nitride Integrated Microwave Switch with Capacitively-Coupled Contacts", IEEE/MTT-S, International Microwave Symposium, pp. 457-460, 2007.

Simin et al., "III-Nitride Transistors with Capacitively Coupled Contacts", Applied Physics Letters 89, pp. 1-3, 2006.

Simin et al., "RF-Enhanced Contacts to Wide-Bandgap Devices", IEEE Electron Device Letters, vol. 28, No. 1, pp. 2-4, Jan. 2007.

Yang et al., "High-Power Operation of III-N MOSHFET RF Switches", IEEE Microwave and Wireless Components Letters, vol. 15, No. 12, pp. 850-852, Dec. 2005.

Cruz, L., U.S. Appl. No. 12/651,470, Notice of Allowance, dated Jul. 18, 2013, 9 pages.

Cruz, L., U.S. Appl. No. 12/651,470, Final Office Action 1, dated Apr. 30, 2013, 11 pages.

Cruz, L., U.S. Appl. No. 12/651,470, Office Action 1, dated Aug. 8, 2012, 13 pages.

Cruz, L., U.S. Appl. No. 14/082,998, Notice of Allowance, dated Feb. 1, 2016, 6 pages.

Cruz, L., U.S. Appl. No. 14/082,998, Final Office Action 1, dated Sep. 16, 2015, 12 pages.

Cruz, L., U.S. Appl. No. 14/082,998, Office Action 1, dated Feb. 10, 2015, 18 pages.

\* cited by examiner

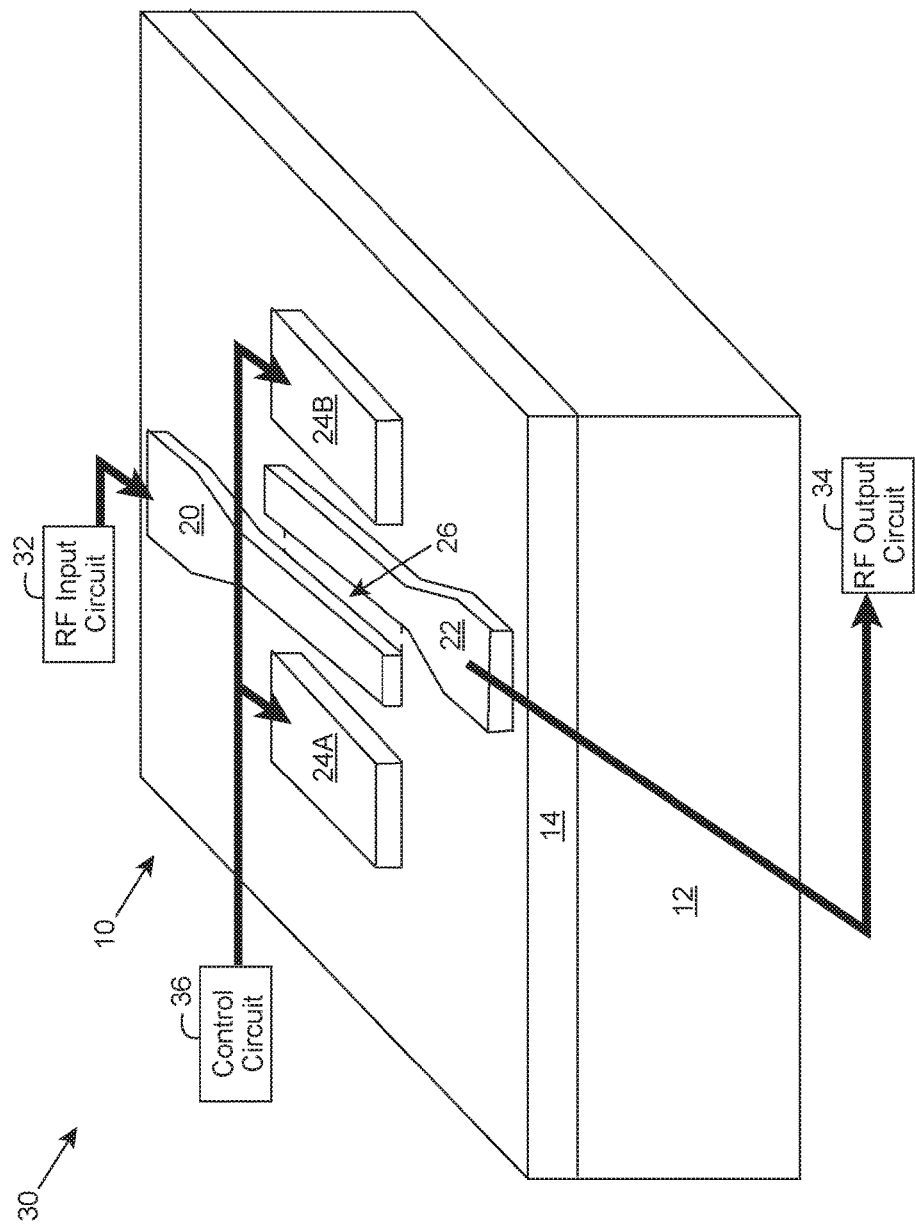

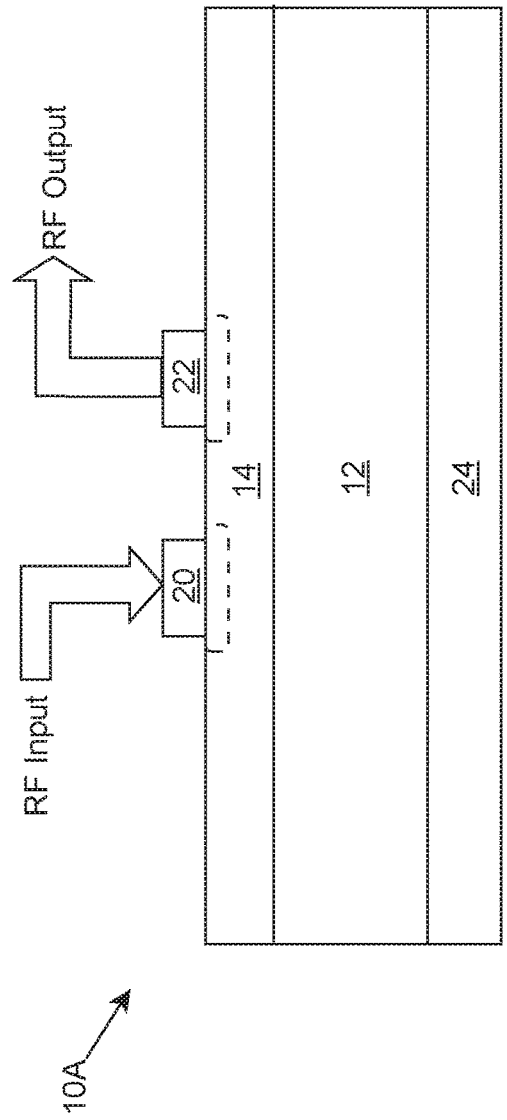

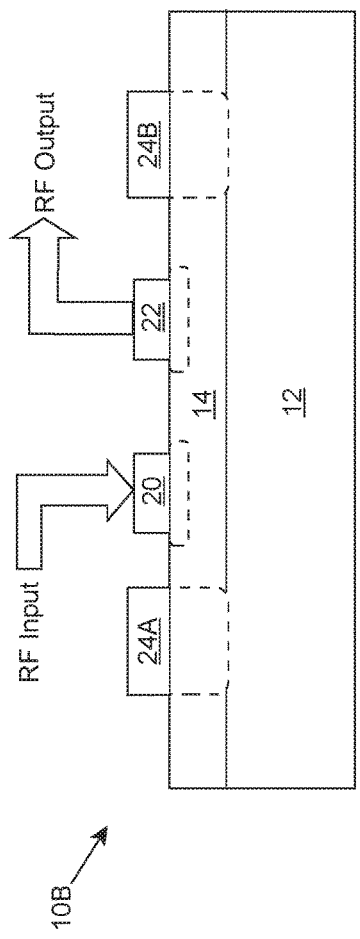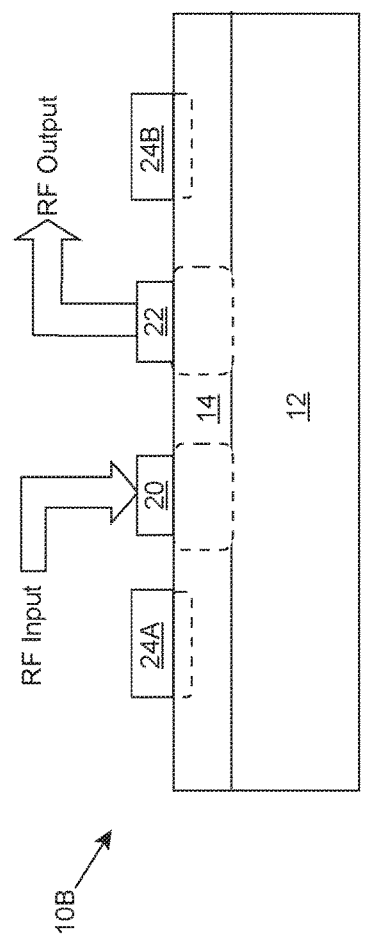

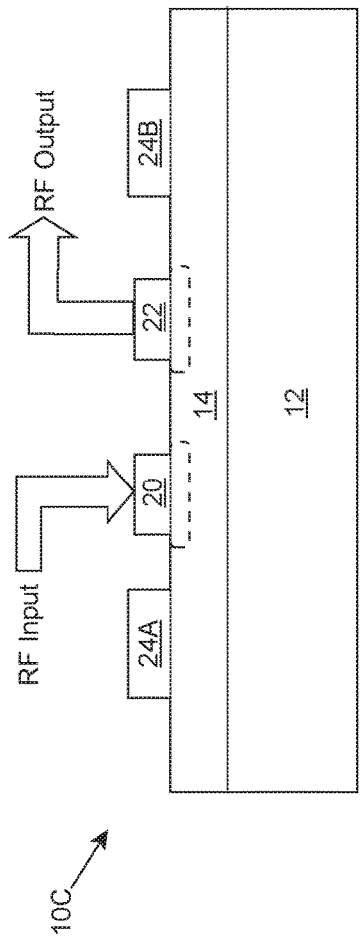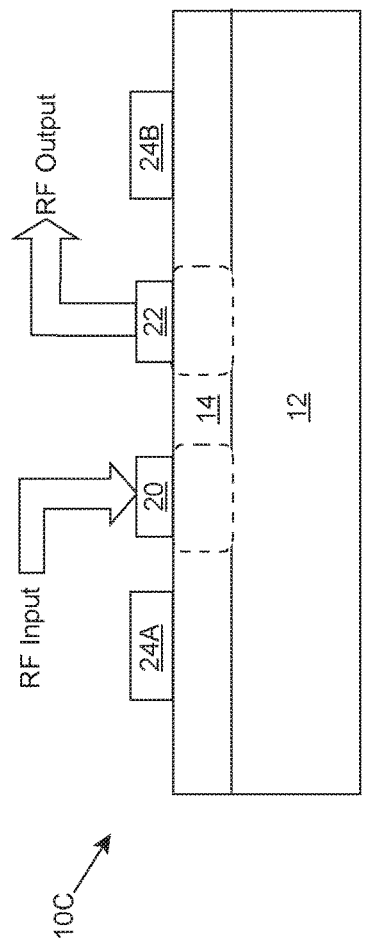

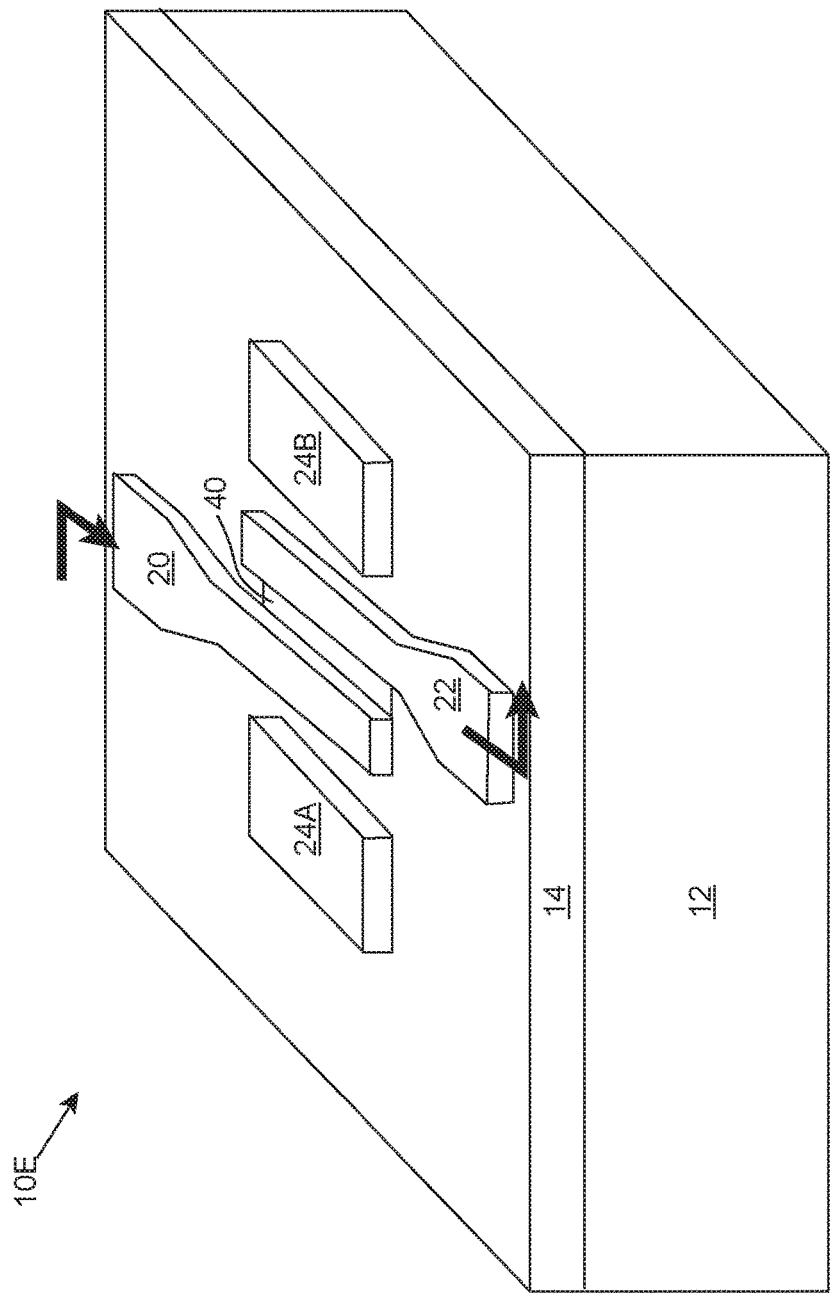

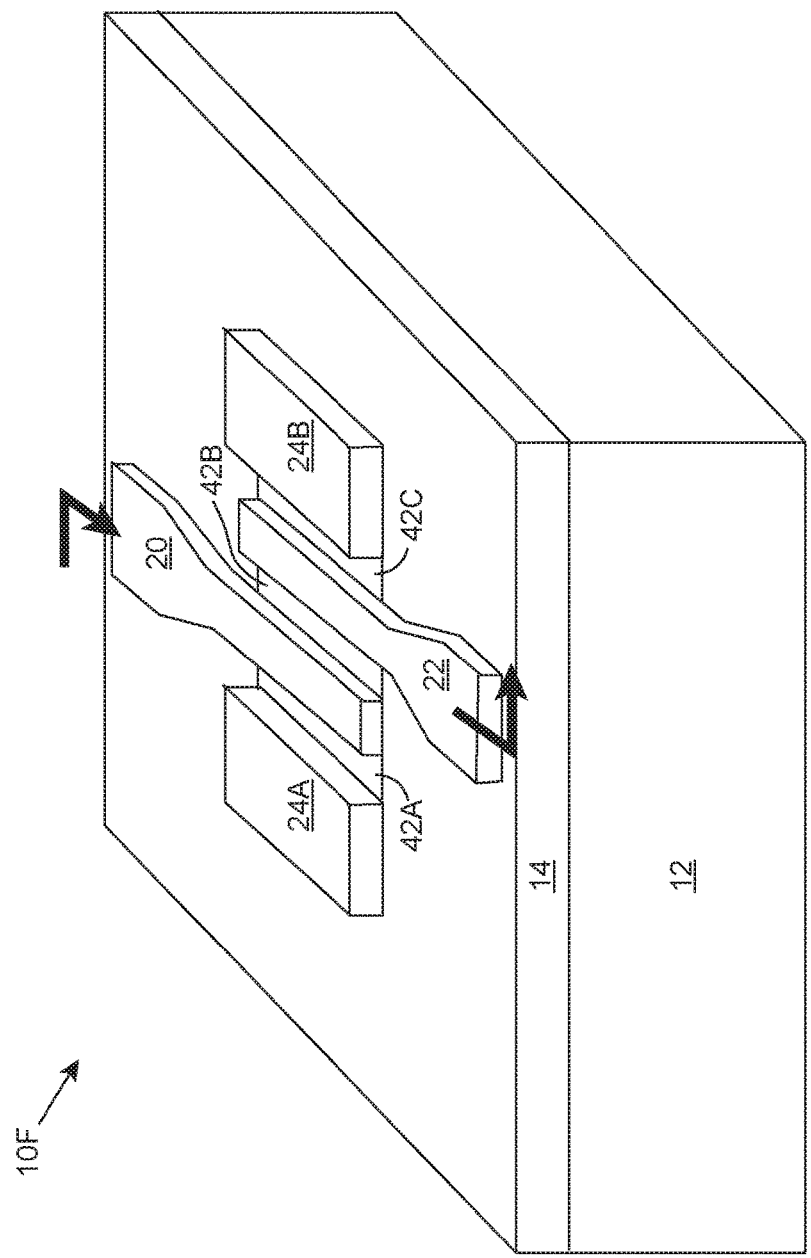

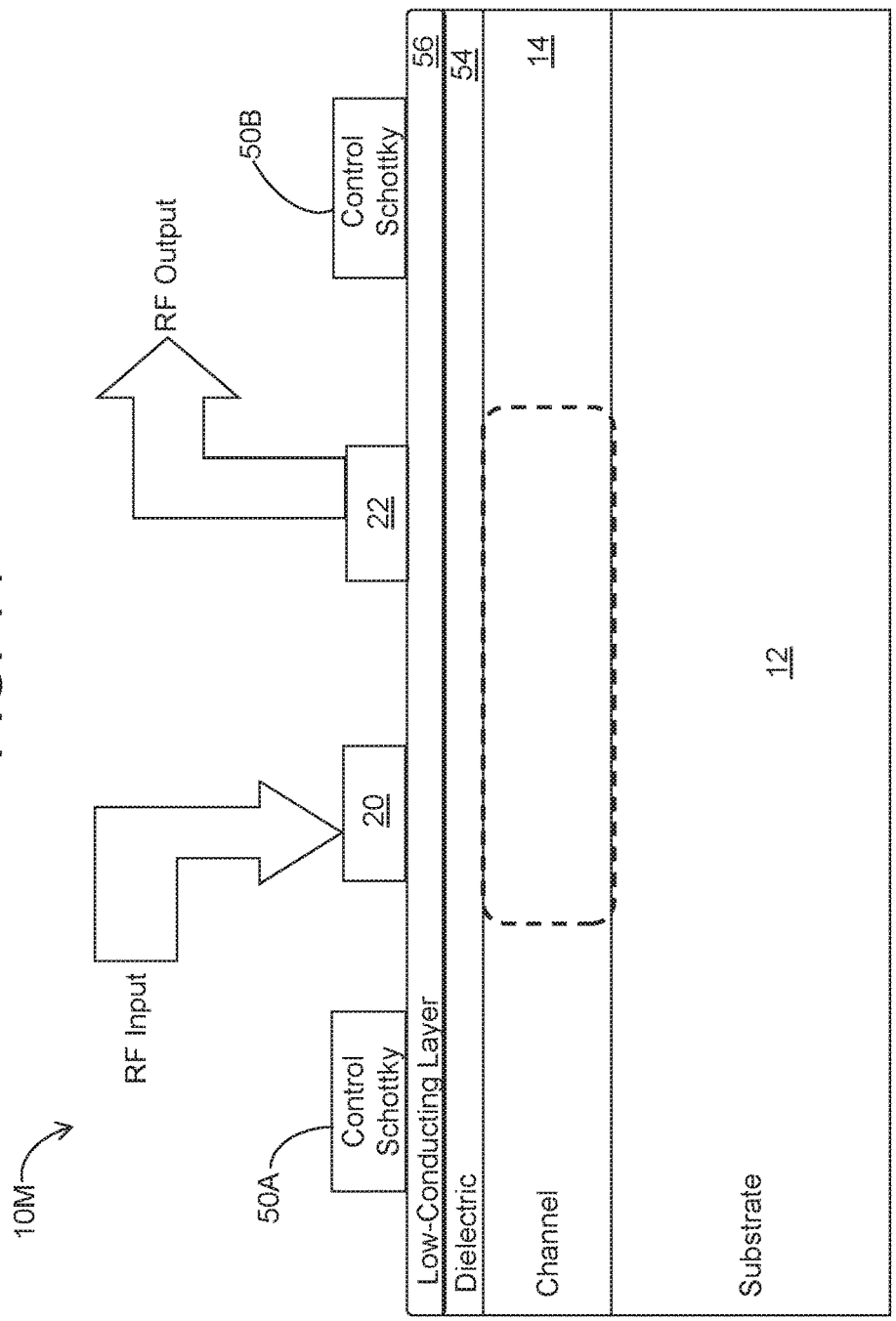

GATELESS SWITCH WITH CAPACITIVELY-COUPLED CONTACTS

REFERENCE TO PRIOR APPLICATIONS

The present patent application is a continuation-in-part application of U.S. application Ser. No. 14/082,998, entitled "Gateless Switch with Capacitively-Coupled Contacts," which was filed on 18 Nov. 2013, which is a continuation of U.S. application Ser. No. 12/651,470, which was filed on 3 Jan. 2010, which issued on 19 Nov. 2013 as U.S. Pat. No. 8,587,028, and which claims the benefit of U.S. Provisional Application No. 61/204,368, titled "Gateless radio-frequency switch with capacitively-coupled contacts," which was filed on 6 Jan. 2009, each of which is hereby incorporated by reference.

GOVERNMENT LICENSE RIGHTS

The U.S. Government has a paid-up license in this invention and the right in limited circumstances to require the patent owner to license others on reasonable terms as provided for by the terms of contract. no. FA8650-09-C-7931 awarded by the United States Air Force (USAF)/Air Force Material Command (AFMC).

TECHNICAL FIELD

The disclosure relates generally to switches, and more particularly, to a gateless switch with capacitively-coupled contacts.

BACKGROUND ART

Solid state radio frequency (RF) switches are important components of Radar transmit/receive (T/R) modules, satellite communication systems, Joint Tactical Radio Systems (JTRS), and the like. A promising RF switch technology uses Heterostructure Field Effect Transistors (HFETs). Recently, high power switches made of AlGaN/GaN HFETs demonstrated superior performance over other RF switching devices in terms of maximum power density, bandwidth, operating temperature, and breakdown voltage.

Many applications, including JTRS and low-noise receivers, require RF switches with a very low insertion loss, e.g., typically below 0.3 decibels (dB). A low loss switch dissipates little RF power. As a result, it can be fabricated over a low cost substrate, such as sapphire. Low insertion loss in an HFET is due to a high channel conductance of the device, which is proportional to a total length of the device periphery. Exceptionally high 2D electron gas densities at the AlGaN/GaN interface make a group III-Nitride HFET with a total periphery of two to five mm an ideal candidate for RF switching applications.

The feasibility of high-power broad-band monolithically integrated group III-Nitride HFET RF switches has been demonstrated. Large signal analysis and experimental data for a large periphery group III-Nitride switch indicate that the switch can achieve switching powers exceeding +40 to +50 dBm.

Quality ohmic contact formation is a significant problem in the manufacture of wide band gap semiconductor devices. In particular, high temperature annealing (e.g., at 850-900 degrees Celsius) leads to material degradation during post-growth processing in the manufacturing process. For operating frequencies in the gigahertz range, group III-Nitride-based RF switches can be manufactured using capacitively-coupled contacts. The manufacture of such capacitively-coupled contacts can be performed using a self-aligned metallization process that does not require contact annealing. This process provides a reduction in material degradation and simultaneous formation of RF input, output and control electrodes. RF switches with capacitively-coupled contacts can be manufactured using either Schottky electrodes deposited over a wide band gap barrier layer or metal-oxide-semiconductor (MOS) structures with electrodes formed over oxide-semiconductor heterojunction films.

The resulting RF switch with capacitively-coupled contacts can comprise a very low contact resistance at RF frequencies, particularly frequencies of approximately two gigahertz and above. Additionally, such group III-Nitride switches have been shown to be capable of low-loss high power RF switching. For example, a group-III Nitride RF switch with capacitively-coupled contacts has provided insertion loss below one decibel with isolation of thirty decibels in the frequency range of one to eleven gigahertz.

SUMMARY OF THE INVENTION

This Summary Of The Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the invention provide a switch, which includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency switch in a circuit.

A first aspect of the invention provides a switch comprising: a semiconductor structure including a conducting channel; an input contact to the conducting channel located on a surface of the semiconductor structure; an output contact to the conducting channel located on the surface of the semiconductor structure, the output contact separated from the input contact by a planar portion of the surface of the semiconductor structure defining a flat input-output region, wherein at least one of the input contact or the output contact is capacitively coupled to the conducting channel; and at least one control contact located outside of the input-output region formed between the input contact and the output contact.

A second aspect of the invention provides a circuit comprising: a radio frequency (RF) switch including: a semiconductor structure including a conducting channel; an input contact to the conducting channel located on a surface of the semiconductor structure; an output contact to the conducting channel located on the surface of the semiconductor structure, the output contact separated from the input contact by a continuous portion of the surface of the semiconductor structure extending between the input contact and the output contact, defining an input-output region without any semiconductor structure formed thereon, wherein at least one of the input contact or the output contact is capacitively coupled to the conducting channel; and at least one control contact to control one of the input contact and the output contact that is located outside of the input-output region; a RF input electrically connected to the input contact; a RF output electrically connected to the output contact; and a RF control circuit electrically connected to the at least one control contact.

A third aspect of the invention provides a circuit comprising: a radio frequency (RF) switch including: a semiconductor structure including a conducting channel; an input contact to the conducting channel located on a surface of the semiconductor structure; an output contact to the conducting channel located on the surface of the semiconductor structure, the output contact separated from the input contact by a portion of the surface of the semiconductor structure extending between the input contact and the output contact, defining an input-output region without any semiconductor structure formed thereon, wherein at least one of the input contact or the output contact is capacitively coupled to the conducting channel; an input control contact to the input contact; and an output control contact to the output contact, wherein both the input control contact and the output control contact are separated from each other by the input contact and the output contact, and wherein both the input control contact and the output control contact are located outside of the input-output region formed between the input contact and the output contact; a RF input electrically connected to the input contact; a RF output electrically connected to the output contact; and a RF control circuit electrically connected to the at least one input control contact and the output control contact.

Other aspects of the invention provide circuits, devices, and methods of designing, using and generating each, which include and/or utilize some or all of the switches and circuits described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 1 shows an illustrative gateless switch and an illustrative circuit including the switch according to an embodiment.

FIG. 2 shows a cross section of an illustrative switch with a control contact located on an opposing side of the conducting channel from the input and output contacts according to an embodiment.

FIGS. 3A and 3B show a cross section of an illustrative switch in the on state and off state, respectively, according to an embodiment.

FIGS. 4A and 4B show a cross section of another illustrative switch in the on state and off state, respectively, according to an embodiment.

FIGS. 6A and 6B show illustrative switches including one or more low conducting layers between the contacts according to embodiments.

FIG. 14 shows a cross section of a switch having an input contact, an output contact, and control contacts formed on a low-conducting layer, which is formed on a dielectric layer according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 5:
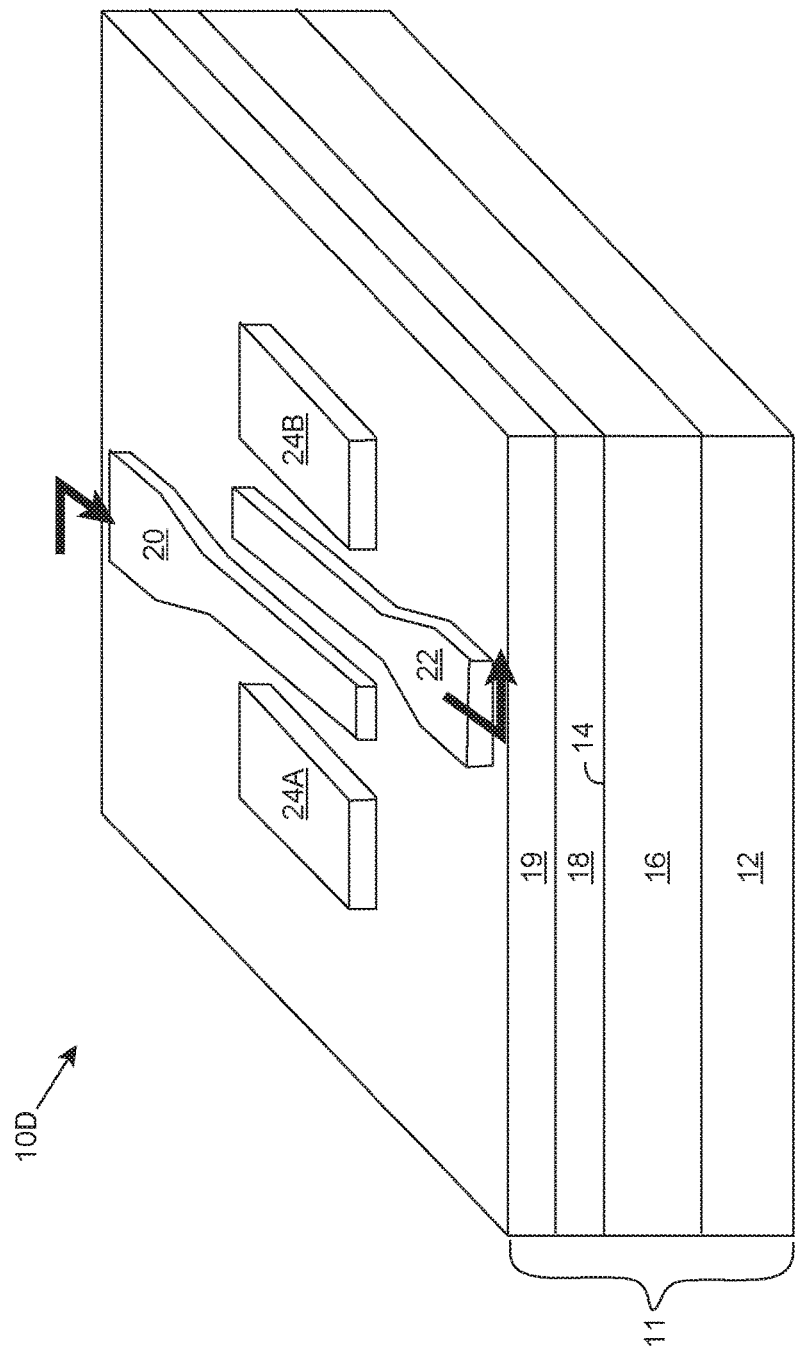
FIG. 5 shows an illustrative switch implemented using a heterostructure switch technology according to an embodiment.

As indicated above, aspects of the invention provide a switch, which includes an input contact and an output contact to a conducting channel. At least one of the input and output contacts is capacitively coupled to the conducting channel. A control contact is located outside of a region between the input and output contacts, and can be used to adjust the switch between on and off operating states. The switch can be implemented as a radio frequency (RF) switch in a circuit. The absence of the control contact in the RF input-RF output spacing can simplify fabrication of the switch, increase an operating voltage for the switch, and/or reduce an off state device capacitance. It is understood that for the purposes of the present invention, Al means Aluminum, As means Arsenic, C means Carbon, In means Indium, Ga means Gallium, Hf means Hafnium, N means Nitrogen, O means Oxygen, P means Phosphorous, and Si means Silicon. As used herein, unless otherwise noted, the term "set" means one or more (i.e., at least one) and the phrase "any solution" means any now known or later developed solution.

Turning to the drawings, FIG. 1 shows an illustrative gateless switch 10 according to an embodiment. As illustrated, switch 10 includes a substrate 12 on which a conducting channel 14 is located. Substrate 12 can comprise any type of substrate, such as sapphire, substrate materials with a low dielectric permittivity, or the like.

As described further herein, channel 14 can be formed using any type of elementary or compound semiconductor material system. In an embodiment, channel 14 comprises a heterostructure channel formed at an interface of a barrier layer comprising a wide band gap and a buffer layer comprising a band gap that is narrower than the band gap of the barrier layer. For example, channel 14 can be formed using compound semiconductor heterostructures including two or more layers of materials selected from the group-III nitride material system (e.g., $Al_xIn_yGa_{1-x-y}N$, where $0 \leq X, Y \leq 1$, and X+Y≤1 and/or alloys thereof), two or more layers of materials selected from the group-III arsenide material system (e.g., $Al_xGa_{1-x}As$, where 0≤X≤1, and/or alloys thereof), two or more layers of materials selected from the InGaP material system (e.g., $In_xGa_{1-x}P$, where 0≤X≤1, and/or alloys thereof), and/or the like. Additionally, the channel 14 can be formed by n- or p-doped layers of silicon, germanium, or any other type of semiconductor materials.

Switch 10 further includes an input contact 20 and an output contact 22. Each contact 20, 22 can comprise a layer of metal, such as for example, titanium, aluminum, nickel, gold, and/or the like. One or both contacts 20, 22 can comprise a capacitively coupled contact, which comprises a metal contact 20, 22 capacitively coupled to the conducting channel 14. To this extent, an insulating layer can be located between the metal layer of the contact 20, 22 and the channel 14. The insulating layer can comprise any type of insulating material, such as a dielectric. For example, the insulating material can include oxygen containing dielectric materials (e.g., $SiO_2$, $HfO_2$, or the like), nitrogen containing dielectric materials, such as a SiN compound (e.g., SiN, $Si_3N_4$), and/or the like. In an embodiment, a capacitively coupled contact 20, 22 comprises a multi-layered contact, which includes an insulating layer located over the conducting channel 14 and a metal layer located over the insulating layer. However, an insulating layer can be formed using any solution. For example, a semiconductor material on which contacts 20, 22 are formed can include a depletion region over which the contacts 20, 22 are located. Alternatively, a highly resistive semiconductor material can form the insulating layer. Furthermore, the insulating layer can be formed by an air gap between the contacts 20, 22 and the semiconductor structure including channel 14.

Switch 10 also includes at least one control contact, such as control contacts 24A, 24B. Each control contact 24A, 24B is located outside of an input-output region 26 defined by adjacent sides of contacts 20, 22, making switch 10 a gateless switch. A control contact 24A, 24B can comprise any type of contact having a strong coupling (ohmic or capacitive or Schottky) with the conducting channel 14. To this extent, an illustrative control contact 24A, 24B can comprise a capacitively coupled contact to the channel 14, which can be configured similar to contacts 20, 22 as shown and described herein. Alternatively, an illustrative control contact 24A, 24B can comprise an ohmic contact to the channel 14. The ohmic contact can comprise a metal layer (e.g., titanium, aluminum, nickel, gold, and/or the like). In an embodiment, the ohmic contact further includes a contact layer on which the metal layer is formed. The contact layer can comprise at least Al and In. For example, the contact layer can comprise a p-type semiconductor and substantially consists of Al, In, Ga, and N.

In an embodiment, switch 10 operates as a radio frequency (RF) switch in which input contact 20 is a RF input contact and output contact 22 is a RF output contact in an integrated high power semiconductor device circuit 30. Circuit 30 can be implemented as part of a semiconductor device configured to implement any type of application, including but not limited to, a radar, a detector, a power amplifier, a rectifier, a wireless communication unit, any type of power converter, and/or the like.

Circuit 30 is shown including a RF input circuit 32, which generates a RF signal and transmits the RF signal to input contact 20. When switch 10 is operating in the on state, the RF signal is transmitted from input contact 20 to output contact 22 via conducting channel 14, and is further transmitted to a RF output circuit 34 included in circuit 30. In an embodiment, input contact 20 is monolithically integrated with an input transmission line from RF input circuit 32, and output contact 22 is monolithically integrated with an output transmission line to RF output circuit 34. Control circuit 36 is electrically connected to one or more of the control contact(s) 24A, 24B and is configured to turn switch 10 on and off using the control contacts(s) 24A, 24B.

In an embodiment, control circuit 36 modulates the operating state of switch 10, and the transmission between contacts 20, 22, electro-statically. To this extent, control circuit 36 can apply a voltage bias to one or both control contacts 24A, 24B, which modulates a depletion region under one or both contacts 20, 22. As a result, an input-output impedance for switch 10 is also adjusted.

While switch 10 is shown including two control contacts 24A, 24B located on a surface of switch 10 adjacent to contacts 20, 22, respectively, it is understood that control contact(s) 24A, 24B can be located anywhere on switch 10 outside of region 26. For example, control contact(s) 24A, 24B can be located on an opposing side of channel 14 from contacts 20, 22. To this extent, FIG. 2 shows a cross section of an illustrative switch 10A with a control contact 24 located on an opposing side of the conducting channel 14 from the input contact 20 and output contact 22 according to an embodiment. As illustrated, a single control contact 24 can be located below substrate 12. In one embodiment, the control contact 24 can form a Schottky-type contact to the conducting channel 14. In another embodiment, substrate 12 can comprise a conducting substrate, such as SiC, GaN, and/or the like, which can be configured to function as a control contact as described herein.

FIGS. 3A and 3B show a cross section of an illustrative switch 10B in the on state and off state, respectively, according to an embodiment. Switch 10B is implemented with capacitively coupled control contacts 24A, 24B. The dashed areas under the contacts 20, 22, 24A, 24B indicate depletion regions. The length and the width of the depletion regions under the input contact 20 and output contact 22 increase as a reverse bias voltage between the contacts 20, 22 and the channel 14 increases. The bias voltage (electrical potential difference) is supplied by control contacts 24A, 24B located outside the input-output region 26 (FIG. 1).

In the on state shown in FIG. 3A, control contacts 24A, 24B can supply a zero or forward voltage bias between the control contacts 24A, 24B and contacts 20, 22, which generates the corresponding depletion regions under the respective contacts 20, 22, 24A, 24B. In particular, a reverse bias voltage can be applied to control contacts 24A, 24B. In this case, the depletion regions under control contacts 24A, 24B extend such that the channel 14 disappears under control contacts 24A, 24B. However, contacts 20, 22 are forward biased. As a result, the depletion regions under contacts 20, 22, are relatively small, allowing the signal to pass from input contact 20 to output contact 22.

In the off state shown in FIG. 3B, a forward bias voltage applied to the control contacts 24A, 24B reverse-biases the contacts 20, 22 beyond the pinch-off voltage of the portions of the channel 14 under contacts 20, 22. In particular, since contacts 20, 22 are capacitively coupled to channel 14, the reverse voltage bias applied between the input contact 20 and the channel 14 and between the output contact 22 and the channel 14 generates a depletion region under each of the contacts 20, 22. As the depletion region extends such that the conducting channel 14 under the contact 20, 22 disappears as shown in FIG. 3B, the switch 10B enters a pinched-off mode and the conductance between the contacts 20, 22 becomes very small.

FIGS. 4A and 4B show a cross section of another illustrative switch 10C in the on state and off state, respectively, according to an embodiment. Switch 10C is implemented with ohmic control contacts 24A, 24B. The dashed areas under the contacts 20, 22 indicate depletion regions. Similar to operation of switch 10B shown in FIGS. 3A, 3B, the length and the width of the depletion regions under the input contact 20 and output contact 22 increase as a reverse bias voltage between the contacts 20, 22 and the channel 14 increases. The bias voltage is supplied by control contacts 24A, 24B located outside the input-output region 26 (FIG. 1).

The required voltage bias between contacts 20, 22 and channel 14 to turn the switch off can vary based on the materials used to fabricate contacts 20, 22 and channel 14. For example, for a typical heterostructure channel 14 formed by a group III-nitride material, a voltage bias between approximately 3-8 volts may be required, while a typical heterostructure channel 14 formed by a AlGaAs- or InP-based material may require a voltage bias between approximately 1-3 volts. To obtain the necessary voltage bias using the capacitive control contacts 24A, 24B shown and described with reference to FIGS. 3A and 3B, a voltage bias up to approximately twice the required voltage bias to turn the switch off may need to be applied to control contacts 24A, 24B due to additional voltage across the control contacts 24A, 24B capacitance. However, the ohmic control contacts 24A, 24B shown and described with reference to FIGS. 4A and 4B can require a bias voltage approximately the same as the voltage bias required to turn the switch off.

As discussed herein, the illustrative switches shown and described herein can be manufactured using any of various material systems and technologies. To this extent, FIG. 5 shows an illustrative switch 10D implemented using a heterostructure switch technology according to an embodiment. Switch 10D comprises a heterostructure 11 that includes a substrate 12 on which a buffer layer 16 is located. Further, the heterostructure 11 includes a barrier layer 18 located on the buffer layer 16. A heterostructure channel 14 is formed at an interface of the barrier layer 18 and the buffer layer 16. To this extent, the barrier layer 18 comprises a wide band gap and the buffer layer 16 comprises a band gap that is narrower than the barrier layer 18. Substrate 12 can comprise any type of substrate, such as sapphire, highly resistive silicon, gallium arsenide, SiC, other semiconductor materials, dielectric materials (e.g., diamond), or the like. Buffer layer 16 can be formed using GaN and barrier layer 18 can be formed using AlGaN. Alternatively, buffer layer 16 can be formed using GaAs and barrier layer 18 can be formed using AlGaAs.

Additionally, heterostructure 11 can include an insulating layer 19 located on the barrier layer 18 thereby forming an insulator/semiconductor compound heterostructure. Insulating layer 19 can comprise any type of insulating material, such as a dielectric. To this extent, the insulating material can comprise, for example, oxygen containing dielectric materials (e.g., $SiO_2$, $HfO_2$, or the like). Insulating layer 19 can decrease a capacitance of switch 10D and an amount of leakage current during operation of switch 10D. Further, insulating layer 19 can enable switch 10D to be operated at higher voltages. Additionally, when insulating layer 19 is included, the capacitively coupled contact(s) can comprise only a metal layer.

It is understood that heterostructure 11 is only illustrative of various heterostructures that can be utilized to manufacture a switch. For example, heterostructure 11 can comprise an inverted heterostructure, a metal-semiconductor heterostructure, a doped channel metal-semiconductor heterostructure, a metal oxide semiconductor heterostructure, a metal insulator semiconductor heterostructure, a doped channel metal-insulator-semiconductor heterostructure, a double heterostructure, and/or the like.

In an illustrative embodiment, the switch described herein is configured to provide a lower channel resistance, which can enable the switch to achieve lower loss, higher isolation, or both depending on a layout of a circuit in which the switch is implemented. For example, the switch can include more than one conducting channel 14. The conducting channels 14 can be formed by a heterostructure. To this extent, the heterostructure can comprise a double heterostructure channel formed inside a quantum well of narrower band gap materials placed between wide band gap barrier layers. Further, the channel(s) of an embodiment of the switch described herein can be doped with impurities, thereby increasing an equilibrium carrier concentration in the channel 14, e.g., donors for a n-type channel or acceptors for a p-type channel.

Embodiments of the switch shown and described herein can include one or more additional layers. For example, FIGS. 6A and 6B show illustrative switches 10E, 10F, respectively, including one or more low conducting layers between the contacts according to embodiments. The low conducting layer(s) can be formed using a material such as a semiconductor, a dielectric, a polymer, a liquid, and/or the like. In FIG. 6A, switch 10E includes a low-conducting layer 40 located in the input-output region 26 (FIG. 1). Low-conducting layer 40 can be formed (e.g., deposited) on the surface of the switch 10E between input contact 20 and output contact 22. Low-conducting layer 40 can make electrical contact with both contacts 20, 22.

The steady-state potential at low-conducting layer 40 is the same as that at the contacts 20, 22. Therefore, if the portions of the channel 14 under the contacts 20, 22 are in the pinch-off condition, so is the portion of the channel 14 under the low-conducting layer 40. As a result, the entire channel 14 in the RF input-RF output spacing is depleted resulting in very low input-output capacitance. When the contacts 20, 22 are at zero or positive potential, the entire channel 14 in the RF input-RF output spacing is un-depleted.

In FIG. 6B, switch 10F includes three low-conducting layers 42A-42C. Low-conducting layer 42A is located between control contact 24A and input contact 20, low-conducting layer 42B is located between input contact 20 and output contact 22, and low-conducting layer 42C is located between output contact 22 and control contact 24B. Each conducting layer 42A-42C can make electrical contact with both of the corresponding adjacent contacts. In addition to depleting the entire channel 14, low-conducting layers 42A-42C also can reduce the capacitance between the contacts 20, 22 and the control contacts 24A, 24B.

Figure 7:
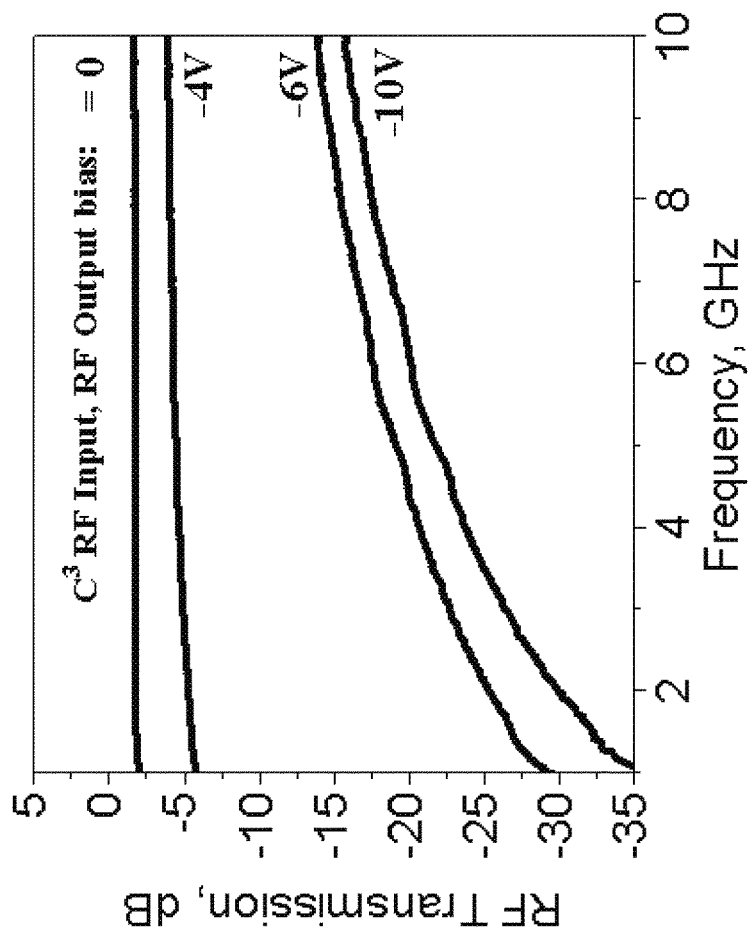
FIG. 7 shows RF transmission of an illustrative switch manufactured using capacitively coupled contacts for the input contact, output contact, and both control contacts according to an embodiment.

FIG. 7 shows RF transmission of an illustrative switch manufactured using the capacitively coupled contacts for the input contact, output contact, and both control contacts according to an embodiment. As illustrated, at a zero or negative voltage bias at the control contacts, the switch is in the on state. At a negative voltage bias at the input and output contacts (a positive bias at the control contacts), the switch is in the off state. In the off state, the conducting channel between the input and output contacts disappears, and the RF coupling between the input and output contacts is only provided by small edge capacitances of the contacts to the channel between the contacts (e.g., below input-output spacing 26 of FIG. 1). When a low-conducting layer is included between the input and output contacts, the capacitance further reduces down to a geometrical capacitance between the two metal electrodes (typically less than 0.1 picofarad/millimeter (pF/mm).

Figure 8:
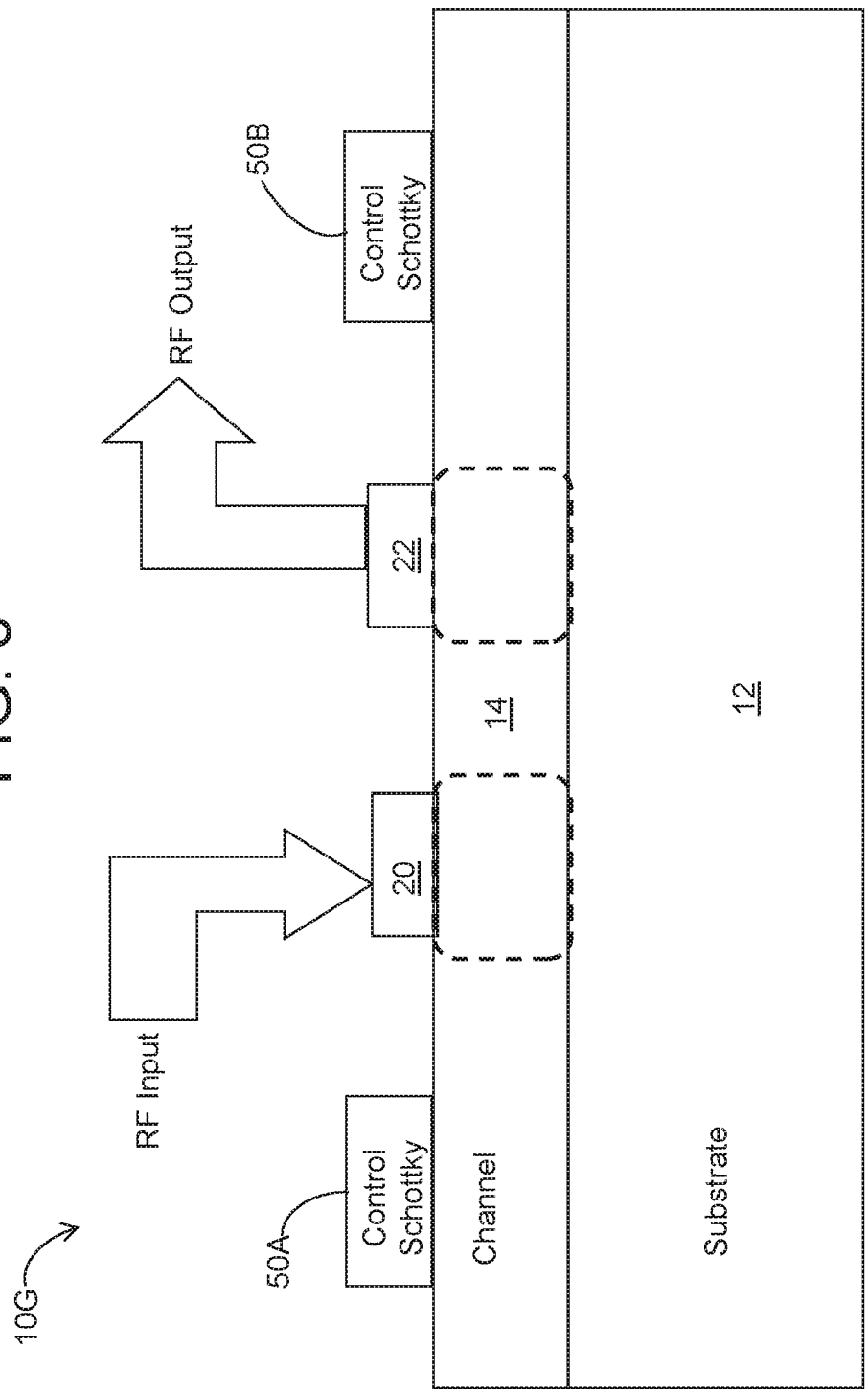
FIG. 8 shows a cross section of a switch with control contacts to an input contact and an output contact in the form of Schottky-type contacts according to an embodiment.

FIG. 8 shows a cross section of a switch 10G that includes the contacts 20 and 22, with the contact 20 serving as the input contact for the RF input, and the contact 22 serving as the output contact for the RF output. The semiconductor material on which the contacts 20 and 22 are formed can include depletion regions over which each of the contacts 20, 22 are located. As with other figures presented herein, the depletion regions are depicted in FIG. 8 by the dotted line regions. The switch 10G can also include at least one control contact such as a control contact 50A to the contact 20 and a control contact 50B to the contact 22, that are both located outside of the input-output region formed on the surface between the input contact 20 and the output contact 22.

In one embodiment as shown in FIG. 8, the input contact 20 and the output contact 22 form capacitively-coupled contacts to the channel 14, while the control contacts 50A and 50B can take the form of Schottky-type contacts to the channel 14. Having the control contacts 50A and 50B take the form of Schottky-type contacts to the channel 14 can eliminate the need of using annealed contacts in the device fabrication of the switch 10G.

Figure 9:
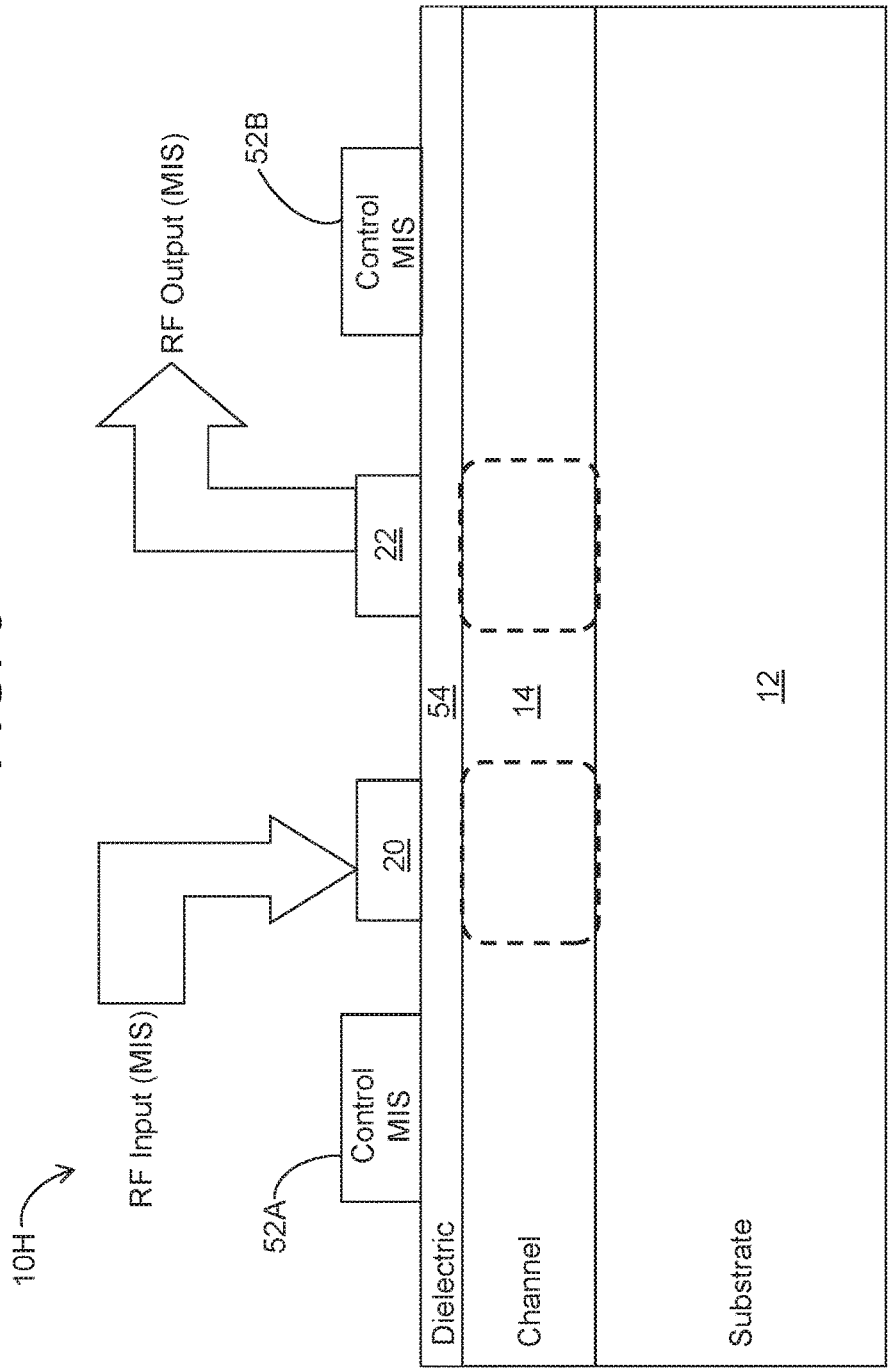
FIG. 9 shows a cross section of a switch having an input contact, an output contact, and control contacts in the form of metal-insulator-semiconductor structures according to an embodiment.

FIG. 9 shows a cross section of an RF switch 10H having the input contact 20, the output contact 20, and control contacts 52A and 52B in the form of metal-insulator-semiconductor structures (control MIS structures) according to an embodiment. As shown in FIG. 9, the switch 10H can include a dielectric layer 54 formed between the conducting channel 14 and the input contact 20, the output contact 22, the input-output region formed on the surface between the input and output contacts, and at least one control contact such as the control MIS contacts 52A and 52B. In this manner, the depletion regions formed in the channel 14 underneath the input contact 20 and the output contact 22 are also underneath the dielectric layer 54 such that each depletion region is in vertical alignment with one of the input contact and the output contact.

In one embodiment, the dielectric layer 54 can include, but is not limited to a layer of $SiO_2$, $Si_3N_4$, $Al_2O_3$, $HfO_2$, and/or the like. Although FIG. 9 shows the dielectric layer 54 extending over all of the channel 14, it is understood that the dielectric layer can extend over only selected portions of the channel 14. For example, all of or some of the input contact 20 and the output contact 22, and all of or some of the control MIS contacts 52A and 52B can be located over the dielectric layer 54. In this manner, the dielectric layer 54 with the input contact 20, and the output contact 22 can form a metal-insulator-semiconductor structure via the control MIS contacts 52A and 52B. Having a metal-insulator-semiconductor structure with a contact design like that depicted in FIG. 9 enables the switch 10H to further reduce device capacitance and leakage current.

Figure 10:
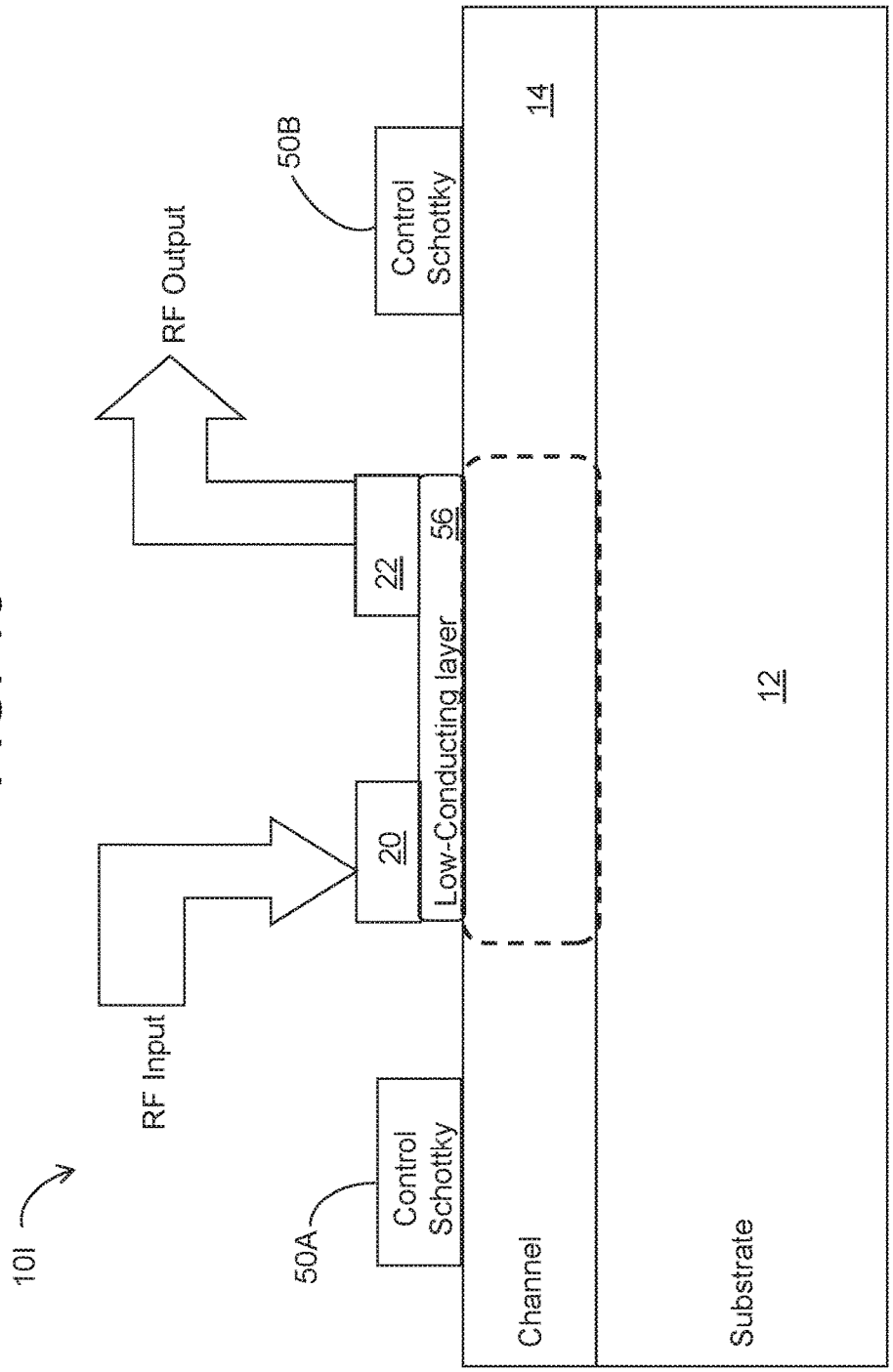
FIG. 10 shows a cross section of a switch having an input contact and an output contact formed on a low-conducting layer according to an embodiment.

FIG. 10 shows a cross section of a switch 10I in which the input contact 20 and the output contact 22 are formed on a low-conducting layer 56 according to an embodiment. As shown in FIG. 10, the control contact 50A is to the input contact 20, while the control contact 50B is to the output contact 22. In one embodiment, both the control contact 50A and the control contact 50B can take form of a Schottky-type contact. The low conducting layer 56 can include, but is not limited to, a dielectric, metal, a polycrystalline material, and/or the like, or a compound thereof. Illustrative low-conducting materials include, for example: GaN or InGaN or another semiconductor; a low conducting dielectric single crystal; a textured, poly-crystalline or amorphous material; a semi-metal material; oxides of nickel and other metals; and/or the like. As used herein, a low conducting layer is a layer that typically has a sheet resistance between approximately $1 \times 10^3$ Ohms per square and approximately $1 \times 10^7$ Ohms per square. Generally, the low-conducting layer has a surface resistance that is significantly higher than that of metal electrodes, but is also much lower than that of a dielectric material. In one embodiment, the low-conducting layer 56 can have a surface resistance value that ranges from about $10^3$ Ohm/square to about $10^7$ Ohm/square.

In one embodiment as shown in FIG. 10, the low conducting layer 56 can be formed between the input contact 20, the output contact 22 and the conducting channel 14, wherein the low conducting layer extends underneath all of the input contact 20 and the output contact 20, including all of the input-output region formed between the contacts 20 and 22. The use of the low-conducting layer 56 under and between the input contact 20 and the output contact 22 expands the depletion region throughout the entire the input-output region formed between the input contact 20 and 22, and therefore decreases the device capacitance of switch 10I. In one embodiment, the depletion region in the conducting channel 14 is substantially coincident with the input contact 20, the output contact 22 and the input-output region formed between contacts 20 and 22, wherein the depletion region extends continuously from slightly beyond a perimeter of the input contact to slight beyond a perimeter of the output contact.

Figure 11:
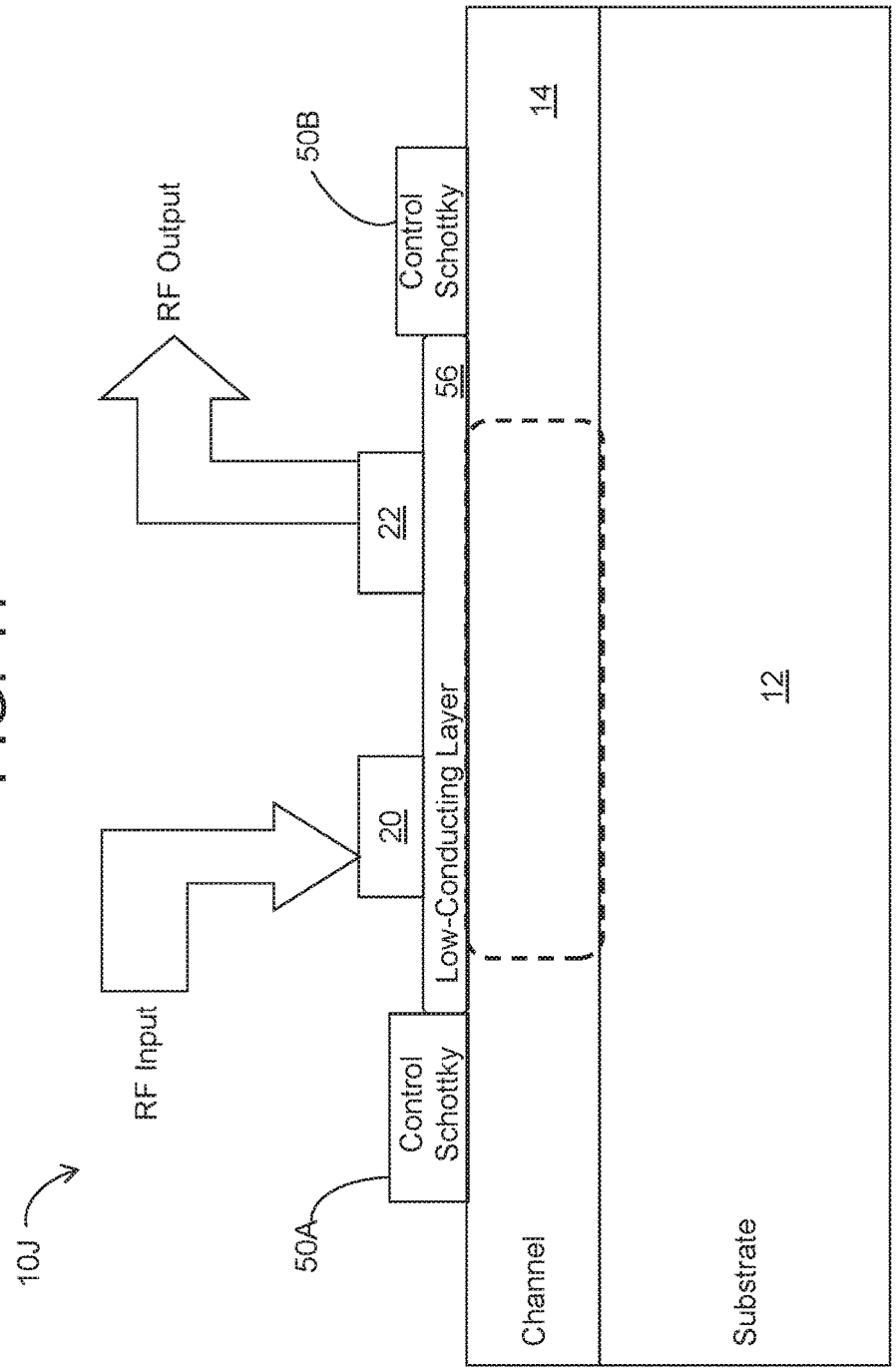
FIG. 11 shows a cross section of a switch having an input contact and an output contact formed on a low-conducting layer with the low-conducting layer contacting a side portion of each control contact according to an embodiment.

Although FIG. 10 shows the low conducting layer 56 formed between the input contact 20 and the output contact 22, including all of the input-output region formed between the contacts 20 and 22, and the conducting channel 14, it is understood that other configurations are possible. For example, FIG. 11 shows a cross section of a switch 10J having the input contact 20 and the output contact 22 formed on the low-conducting layer 56 with the low-conducting layer contacting a side portion of each of the control contacts 50A and 50B according to another embodiment. As shown in FIG. 11, the low conducting layer 56 can extend along the surface of the semiconductor structure underneath each of the input contact 20 and the output contact 22 beyond perimeters of each contact, wherein the low conducting layer contacts a portion of a side of at least one of the control contacts 50A and 50B. Although FIG. 11 shows the low-conducting layer 56 covering all of the space between the input contact 20 and the control contact 50A, and all of the space between the output contact 22 and the control contact 50B, it is understood that the low-conducting layer 56 does not have to cover all of the space between these contacts. For example, the low-conducting layer 56 can provide a partial covering of the spaces between the various contacts. In the embodiment of FIG. 11, having the low-conducting layer 56 extend beyond the input contact 20 and the output contact 22, creates surface potential profiles which further extends the depletion region beyond the input contact 20 and the output contact 22 regions, thereby enabling the switch 10J to further reduce the device capacitance.

Figure 12:
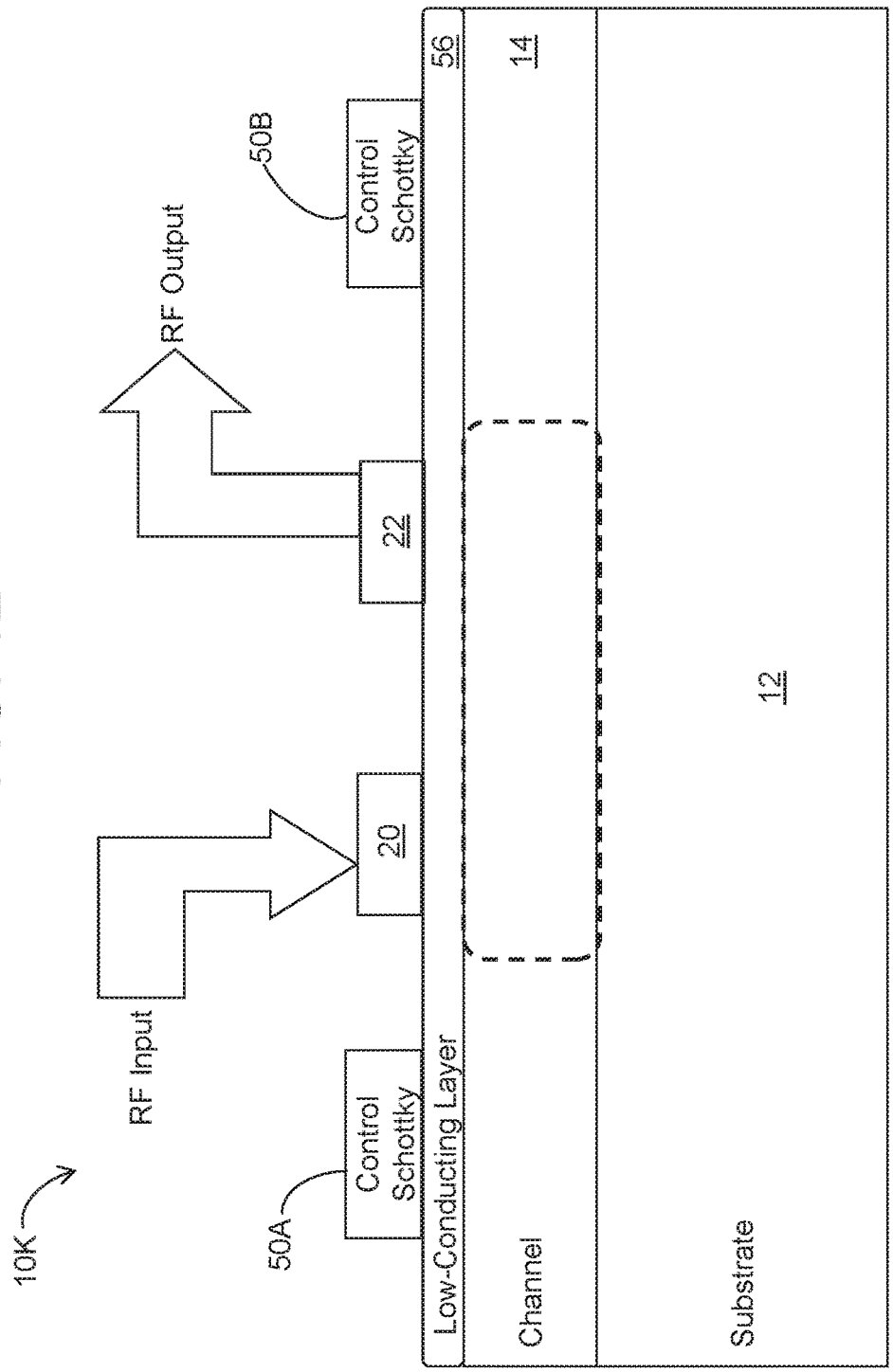
FIG. 12 shows a cross section of a switch having an input contact, an output contact, and control contacts all formed on a low-conducting layer according to an embodiment.

In another embodiment, FIG. 12 shows a cross section of a switch 10K having the input contact 20, the output contact 22, and the control contacts 50A and 50B formed on the low-conducting layer 56. In particular, the low conducting layer 56 can extend along the surface of the semiconductor structure over all of the conducting channel 14, wherein the low conducting layer extends underneath each of the input contact 20, the output contact 22, and at least one of the control contacts 50A and 50B, beyond perimeters of each contact. The use of a continuous low-conducting layer 56 as depicted in FIG. 12 eliminates additional patterning steps during device fabrication, and hence increasing the yield of the devices. It also reduces the peak field at the edges of the contacts 20 and 22, and the edges of control contacts 50A and 50B, thereby increasing the breakdown voltage and device reliability.

Figure 13:
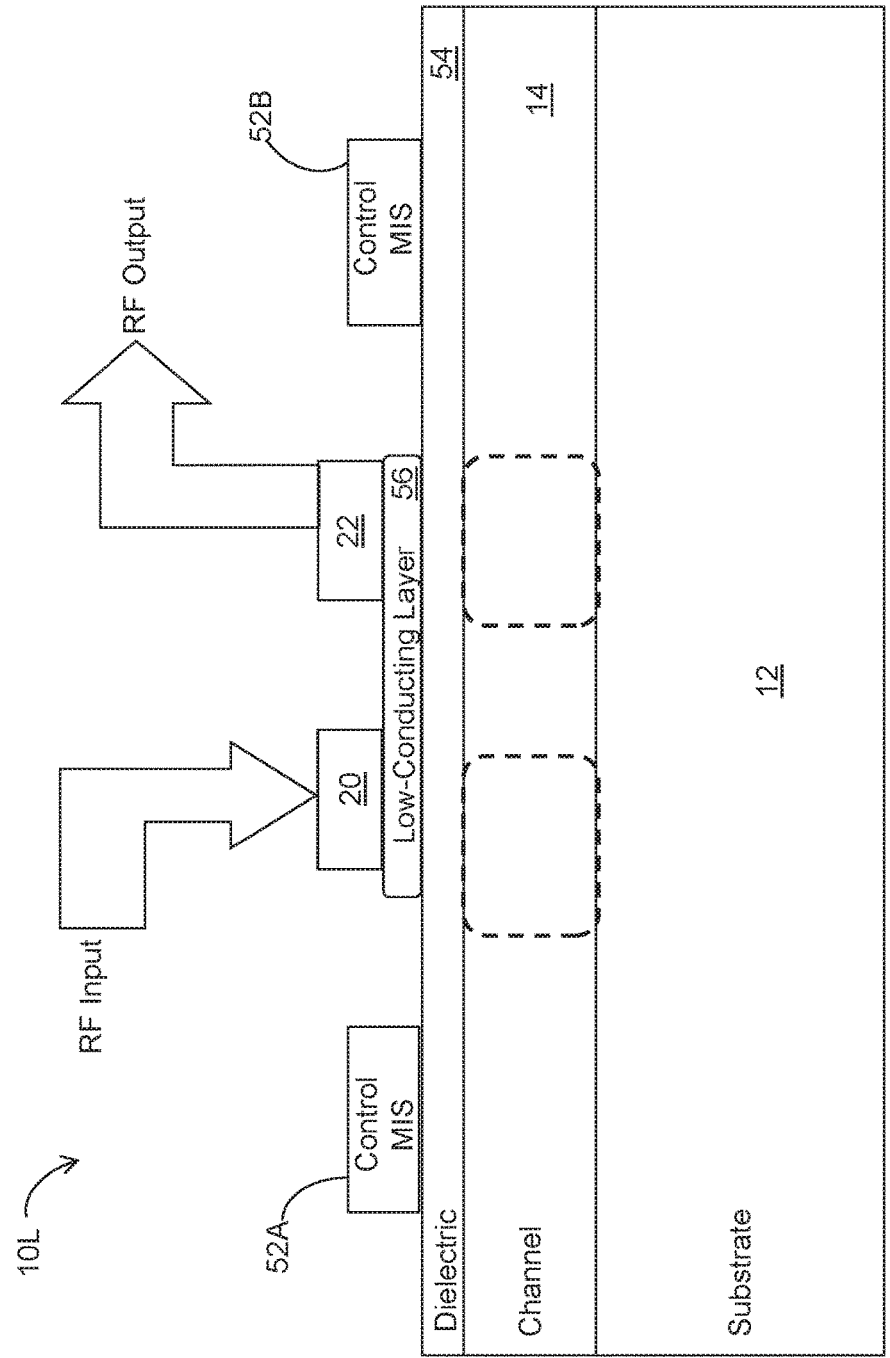
FIG. 13 shows a cross section of a switch having an input contact and an output contact formed on a low-conducting layer, which along with the control contacts is formed on a dielectric layer according to an embodiment.

FIG. 13 shows a cross section of a switch 10L having the input contact 20 and the output contact 22 formed on the low-conducting layer 56, which along with the control MIS contacts 52A and 52B are formed on the dielectric layer 54 according to an embodiment. In one embodiment, the dielectric layer 54 is formed between the conducting channel 14 and the input contact 20, the output contact 22, the input-output region formed on the surface between the input and output contacts, the low-conducting layer 56, and at least one control contact such as the control MIS contacts 52A and 52B. It is understood that in this embodiment the control MIS contacts 52A and 52B can be replaced by a pair of Schottky contacts like those depicted in FIG. 8, 10 or 11. In this embodiment, the depletion region is formed under the RF electrodes 20, 22 and in the spacing between the electrodes 20, 22, under the low-conducting layer 56. Having a contact design like the one depicted in FIG. 13 enables the switch 10L to have a lower capacitance in the OFF-state and hence better performance at higher frequencies.

Although FIG. 13 shows the dielectric layer 54 being only partially covered by low-conducting layer 56, it is understood that other contact design structures that utilize the dielectric layer and the low-conducting layer with the contacts 20 and 22, and the control contacts 52A and 52B exist. For example, FIG. 14 shows a cross section of a switch 10M having the input contact 20, the output contact 22, and the control contacts 52A and 52B formed on the low-conducting layer 56, which is formed on the dielectric layer 54 according to an embodiment. In addition to all the advantages provided by the design shown in FIG. 13, the embodiment shown in FIG. 14 also significantly reduces the effect of trapped charges and surface states on the device performance, thus improving the switching speed, reducing insertion loss and increasing the isolation of the switch.

The various embodiments described herein provide semiconductor gateless RF switches with input and output electrodes or contacts that are capacitively-coupled to a conducting channel, and ohmic or capacitively-coupled control electrodes or contacts located outside the input-output region formed on the surface between the input contact and the output contact. Because a bias applied between control contacts and the input and/or output contacts, modulates the input-output transmission electro-statically, the devices can therefore be referred to as gateless switches. The absence of the control electrodes or contacts in the input-output region or spacing significantly simplifies the fabrication technology especially for RF switches, which increases the operating voltage and reduces the OFF-state device capacitance. Further, the control contacts, the input contacts and the output contacts can form either a Schottky or a metal-insulator-semiconductor structure with the semiconductor, obviating the need to anneal contacts. Also, the surface between the contacts can be covered with a low-conducting layer and/or a dielectric layer to further reduce the device capacitance.

While primarily shown and described herein as a switch and a corresponding circuit, it is understood that aspects of the invention further provide various alternative embodiments. In one embodiment, the invention provides a method of fabricating (manufacturing) a switch described herein. For example, a structure capable of forming one or more conducting channels, such as a heterostructure 11 (FIG. 5), can be obtained using any solution. The structure can be purchased or otherwise acquired, fabricated (e.g., by growing or depositing layer(s) in the heterostructure), or the like. The various contacts 20, 22, 24A, 24B can be formed on a surface of the structure. For example, a metal for each contact 20, 22, 24A, 24B can be deposited and/or shaped using any solution. By forming contacts 24A, 24B outside of the input-output region 26, fabrication of the switch is simplified.

In another embodiment, the invention provides a method of fabricating a circuit, such as circuit 30 of FIG. 1, including the switch described herein. For example, input contact 20 can be electrically connected to a conductor (e.g., transmission line) carrying an RF signal from a RF input circuit 32, and output contact 22 can be electrically connected to a conductor carrying the RF signal to a RF output circuit 34. In an embodiment, the electrical connections are made by monolithically integrating the contacts 20, 22 with the conductors. Further, control contacts 24A, 24B can be electrically connected to a control circuit 36, which generates a control signal for switching the operating state of the switch 10 between on and off states.

In still another embodiment, the invention provides a method of operating a device including the RF switch 10. In particular, the method includes selectively enabling a RF signal to pass from a RF input circuit 32 to a RF output circuit 34 electro-statically, e.g., by modulating depletion regions under an input contact 20 and an output contact 22, which adjusts an impedance for the switch. For example, the switch can be transitioned between on and off operating states by applying a bias voltage to control contact(s) 24A, 24B located outside of the input-output region 26.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A switch, comprising:
a semiconductor structure including a conducting channel;
an input contact to the conducting channel located on a surface of the semiconductor structure;
an output contact to the conducting channel located on the surface of the semiconductor structure, the output contact separated from the input contact by a planar portion of the surface of the semiconductor structure defining a flat input-output region, wherein at least one of the input contact or the output contact is capacitively coupled to the conducting channel; and
at least one control contact located outside of the input-output region formed between the input contact and the output contact, without contacting the input-output region, wherein the at least one control contact includes a first control contact located adjacent to the input contact and a second control contact located adjacent to the output contact, both the first control contact and the second control contact separated from each other by the input contact and the output contact, wherein both the first control contact and the second control contact are located outside of the input-output region formed between the input contact and the output contact, and wherein the input contact, the output contact, the first control contact and the second control contact are all in parallel with each other and laterally aligned across the surface of the semiconductor structure.

2. The switch of claim 1, wherein the at least one control contact is located on the surface of the semiconductor structure and is capacitively coupled to the conducting channel.

3. The switch of claim 1, the semiconductor structure further comprising:
a barrier layer comprising a wide band gap, wherein the input contact and the output contact are located over the barrier layer; and
a buffer layer comprising a band gap narrower than the barrier layer, wherein the conducting channel is formed at an interface of the barrier layer and the buffer layer.

4. The switch of claim 3, the semiconductor structure further comprising an insulating layer located over the barrier layer, wherein the input contact and the output contact are located over the insulating layer.

5. The switch of claim 1, the semiconductor structure further comprising an insulating layer located in the input-output region, wherein the insulating layer contacts the input contact and the output contact.

6. A circuit, comprising:
a radio frequency (RF) switch including:
a semiconductor structure including a channel forming structure forming a conducting channel;
an input contact to the conducting channel located on a surface of the semiconductor structure;
an output contact to the conducting channel located on the surface of the semiconductor structure, the output contact separated from the input contact by a continuous portion of the surface of the semiconductor structure extending between the input contact and the output contact, defining an input-output region without any semiconductor structure formed thereon, wherein at least one of the input contact or the output contact is capacitively coupled to the conducting channel; and
at least one control contact to control one of the input contact and the output contact that is located outside of the input-output region, wherein the at least one control contact is located on the surface of the semiconductor structure and includes a first control contact located adjacent to the input contact and a second control contact located adjacent to the output contact, both the first control contact and the second control contact separated from each other by the input contact and the output contact, wherein both the first control contact and the second control contact are located outside of the input-output region formed between the input contact and the output contact, and wherein the first control contact and the second control contact each forms a Schottky contact to the conducting channel;
a low conducting layer, separate from the channel forming structure, formed about the input contact, the output contact, the first control contact and the second control contact, wherein the low conducting layer includes a first low conducting part that extends from the first control contact to the input contact, a second low conducting part that extends from the input contact to the output contact, and a third low conducting part that extends from the output contact to the second control contact;
a RF input electrically connected to the input contact;
a RF output electrically connected to the output contact; and
a RF control circuit electrically connected to the at least one control contact.

7. The circuit of claim 6, wherein the at least one control contact is located beneath the conducting channel.

8. The circuit of claim 6, further comprising a dielectric layer formed between the conducting channel and the input contact, the output contact, the input-output region, and the at least one control contact.

9. The circuit of claim 8, wherein the at least one control contact forms a metal-insulator-semiconductor structure with the conducting channel.

10. The circuit of claim 8, wherein at least one of the input contact and the output contact forms a metal-insulator-semiconductor structure with the conducting channel.

11. The circuit of claim 6, further comprising a first depletion region and a second depletion region in the conducting channel, wherein the first depletion region is in vertical alignment with the input contact and the second depletion region is in vertical alignment with the output contact.

12. The circuit of claim 6, wherein the low conducting layer extends underneath all of the input contact and the output contact, including all of the input-output region.

13. The circuit of claim 12, further comprising a depletion region in the conducting channel that is substantially coincident with the input contact, the output contact and the input-output region, wherein the depletion region extends continuously from slightly beyond a perimeter of the input contact to slight beyond a perimeter of the output contact.

14. The circuit of claim 12, wherein the low conducting layer extends along the surface of the semiconductor structure underneath each of the input contact and the output contact beyond perimeters of each contact, wherein the low conducting layer contacts a portion of a side of the at least one control contact.

15. The circuit of claim 12, wherein the low conducting layer extends along the surface of the semiconductor structure over all of the conducting channel, wherein the low conducting layer extends underneath each of the input contact, the output contact, and the at least one control contact, beyond perimeters of each contact.

16. The circuit of claim 6, wherein the channel forming structure includes a first layer having a first band gap and a second layer having a second band gap that is narrower than the first band gap, wherein the conducting channel is formed at an interface between the first layer and the second layer.

17. A circuit, comprising:
a radio frequency (RF) switch including:
a semiconductor structure including a channel forming structure forming a conducting channel;
an input contact to the conducting channel located on a surface of the semiconductor structure;
an output contact to the conducting channel located on the surface of the semiconductor structure, the output contact separated from the input contact by a portion of the surface of the semiconductor structure extending between the input contact and the output contact, defining an input-output region without any semiconductor structure formed thereon, wherein at least one of the input contact or the output contact is capacitively coupled to the conducting channel;
an input control contact to the input contact; and
an output control contact to the output contact, wherein both the input control contact and the output control contact are separated from each other by the input contact and the output contact, and wherein both the input control contact and the output control contact are located outside of the input-output region formed between the input contact and the output contact;

a low conducting layer, separate from the channel forming structure, formed about the input contact, the output contact, the input control contact and the output control contact, wherein the low conducting layer includes a first low conducting part that extends from the input control contact to the input contact, a second low conducting part that extends from the input contact to the output contact, and a third low conducting part that extends from the output contact to the output control contact;

a RF input electrically connected to the input contact;

a RF output electrically connected to the output contact; and a RF control circuit electrically connected to the at least one input control contact and the output control contact.

18. The circuit of claim 17, wherein the input control contact and the output control contact each forms a Schottky contact to the conducting channel.

19. The circuit of claim 17, further comprising a dielectric layer formed between the conducting channel and the low conducting layer, wherein the dielectric layer and the low conducting layer both extend underneath all of the input control contact, the input contact, the output contact and the output control contact, including all of the input-output region.

20. The circuit of claim 17, wherein the channel forming structure includes a compound semiconductor heterostructure having two or more layers of materials selected from one of a group-III nitride material system, a group-III arsenide material system, or an InGaP material system.

* * * * *